US007692363B2

(12) United States Patent
Butler et al.

(10) Patent No.: US 7,692,363 B2
(45) Date of Patent: Apr. 6, 2010

(54) MASS LOADED DIPOLE TRANSDUCTION APPARATUS

(75) Inventors: Alexander L. Butler, Weymouth, MA (US); John L. Butler, Cohasset, MA (US)

(73) Assignee: Image Acoustics, Inc., Cohasset, MA (US)

( * ) Notice: Subject to any disclaimer, the term of this patent is extended or adjusted under 35 U.S.C. 154(b) by 38 days.

(21) Appl. No.: 11/541,928

(22) Filed: Oct. 2, 2006

(65) Prior Publication Data

US 2008/0079331 A1 Apr. 3, 2008

(51) Int. Cl.
*H01L 41/04* (2006.01)
*H01L 41/053* (2006.01)

(52) U.S. Cl. ........................ 310/329; 310/330; 310/334

(58) Field of Classification Search ......... 310/330–332, 310/338, 339, 322, 337, 328, 329
See application file for complete search history.

(56) References Cited

U.S. PATENT DOCUMENTS 3,378,814 A 4/1968 Butler
3,845,333 A 10/1974 Holloway
3,924,259 A 12/1975 Butler et al.
4,326,275 A 4/1982 Butler
4,438,509 A 3/1984 Butler et al.
4,443,731 A 4/1984 Butler et al.
4,604,542 A 8/1986 Thompson
4,633,119 A 12/1986 Thompson
4,642,802 A 2/1987 Pozzo et al.
4,654,554 A * 3/1987 Kishi ......................... 381/190
4,742,499 A 5/1988 Butler
4,752,918 A 6/1988 Boucher et al.
4,754,441 A 6/1988 Butler
4,811,307 A 3/1989 Pohlenz et al.
4,845,688 A 7/1989 Butler
4,864,548 A 9/1989 Butler
5,047,683 A 9/1991 Butler et al.
5,081,391 A 1/1992 Owen
5,118,981 A * 6/1992 Kobayashi et al. .......... 310/329
5,184,332 A 2/1993 Butler
5,742,561 A 4/1998 Johnson
5,957,851 A 9/1999 Hossack
6,465,936 B1 10/2002 Knowles et al.
6,643,222 B2 11/2003 Osborn et al.
6,654,316 B1 11/2003 Butler et al.
6,734,604 B2 5/2004 Butler et al.
6,950,373 B2 9/2005 Butler et al.
2002/0043897 A1 4/2002 Dunn et al.
2005/0206275 A1 * 9/2005 Radziemski et al. ........ 310/339
2007/0267940 A1 * 11/2007 Wright ....................... 310/311
2008/0116764 A1 * 5/2008 Heim ......................... 310/329

* cited by examiner

*Primary Examiner*—Walter Benson
*Assistant Examiner*—Derek J Rosenau
(74) *Attorney, Agent, or Firm*—David M. Driscoll, Esq.

(57) ABSTRACT

An electro-mechanical transducer, which provides dipole motion from its housing which is driven by a bender transducer attached to the housing at the outer edge and attached to an inertial mass at its center providing a lower resonance frequency, lower mechanical Q and enhanced motion and acoustical source level.

20 Claims, 1 Drawing Sheet

MASS LOADED DIPOLE TRANSDUCTION APPARATUS

BACKGROUND OF THE INVENTION

1. Field of the Invention

The present invention relates in general to transducers, and more particularly to mass loaded acoustic dipole transducers capable of radiating and receiving acoustic energy at very low frequencies and also capable of withstanding high ambient pressures.

2. Background Discussion

Underwater sound dipole transducers can be designed to withstand high pressures by the use of a structurally enclosed housing which is operated so as to be set into translational motion by an enclosed attached transducer. These devices have been called "shaker box transducers". In operation the housing ("box") is moved back and forth in the medium alternately creating a pressure increase on one side and pressure decrease on the opposite side which results in a dipole beam pattern from the housing acting as a dual-sided piston radiator. The attached interior driving transduction device can be constructed from piezoelectric ceramic such as PZT. One such structural form of the PZT is referred to as the bender type which allows a large displacement at low frequencies. In this case the ends of the bender are attached to the housing and the center part of the bender moves laterally against the attachment causing the box to move. In previous designs the inertial reaction mass has been based only on the inherent dynamic mass of the bender structure itself.

One form of transducer is shown in my earlier U.S. Pat. No. 4,754,441 entitled "Directional Flextensional Transducer" issued on Jun. 28, 1988. This prior art patent illustrates an elliptical transducer that is driven into a dipole mode by a bending action and including an outer shell that supports a drive stack that may be comprised of piezoelectric or magnetostrictive material. However, in this transducer the stack does not use any central reaction mass.

It is an object of the present invention to provide an improved electro-mechanical transduction apparatus constructed and arranged so as to increase the motion of the housing and create greater acoustic intensity by attachment of a reactive inertial mass or masses to the center of the bender reducing the motion at that point and translating this motion to the edge mount on the box causing greater box or housing motion.

Another object of the present invention is to provide an improved acoustic transducer in which the resonance frequency and mechanical Q are lowered through the attachment of the aforementioned mass or masses.

SUMMARY OF THE INVENTION

To accomplish the foregoing and other objects, features and advantages of the invention there is provided an improved electro-mechanical bender transduction apparatus that employs means for utilizing added mass to the electro-mechanical drivers in a way that creates greater motion of the enclosing attached housing causing greater piston like dipole motion and greater source strength.

In accordance with one embodiment of the present invention there is provided an electro-mechanical transduction apparatus that is comprised of: a housing; two piezoelectric bars or plates; a central member separating the two and attached at its ends to the housing and which acts as the acoustic radiating member and one or more masses that are attached to either the central member or the piezoelectric bars or plates. The two piezoelectric members may be wired for opposite extension creating a bending mode which through the edge mounting moves the housing relative to the attached central inertial masses. With an alternating electrical drive, the housing moves in a translational body motion creating a dipole acoustic radiator. Conversely the device produces a voltage on detecting the acoustic particle velocity of a wave in the medium and in this case acting as a vector hydrophone for an incoming acoustic wave with maximum output for the wave arriving in the direction of translational motion. The added masses produce greater acoustic intensity in the drive mode and greater output voltage in the receive mode, as well as a lower resonance frequency and lower mechanical Q.

In one preferred cylindrical embodiment of the invention two piezoelectric circular plates are attached to an inert central plate with mass loading at its center point. The outer edge of the central plate is preferably attached midway along the length of the cylindrical tube housing with end caps that act as the radiating pistons. The inert central plate is approximately the same thickness as the piezoelectric plates and the two piezoelectric plates are wired for bending operation. The mass loading is made as great as practical to produce the greatest motion at the pistons.

In accordance with another aspect of the present invention there is also provided an electro-mechanical apparatus that comprises: a plurality of piezoelectric drivers; an enclosed housing attached to an intermediate support member; a plurality of pistons as part of or attached to the housing; and a plurality of masses attached to the intermediate member or the piezoelectric driver. The masses are preferably attached to the intermediate member.

As a reciprocal device the transducer may also be used as a receiver. The transducer may be used in a fluid medium, such as water, or in a gas, such as air. Although the embodiments illustrate means for acoustic radiation into a medium from pistons, alternatively, a mechanical load could replace the medium and in this case the transducer would be an actuator.

BRIEF DESCRIPTION OF THE DRAWINGS

Numerous other objects, features and advantages of the invention should now become apparent upon a reading of the following detailed description taken in conjunction with the accompanying drawings, in which.

DETAIL DESCRIPTION

Figure 1A:
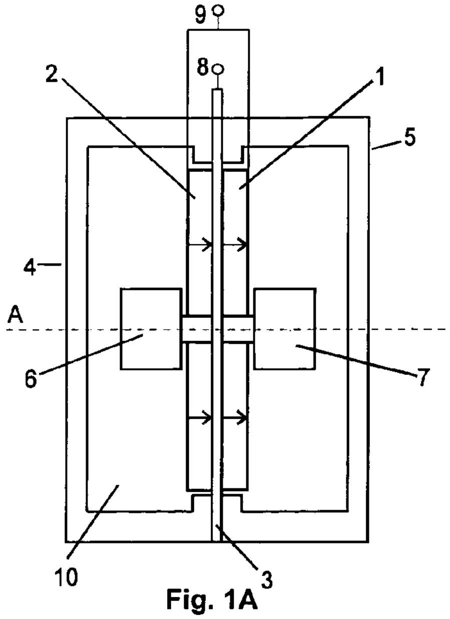
FIG. 1A is a schematic cross-sectional view of a low profile cylindrical embodiment showing the principles of the present invention applied to two piezoelectric discs with an attached intermediate member support disc and masses attached at the center with the periphery of the intermediate disc attached to the housing.
Figure 1B:
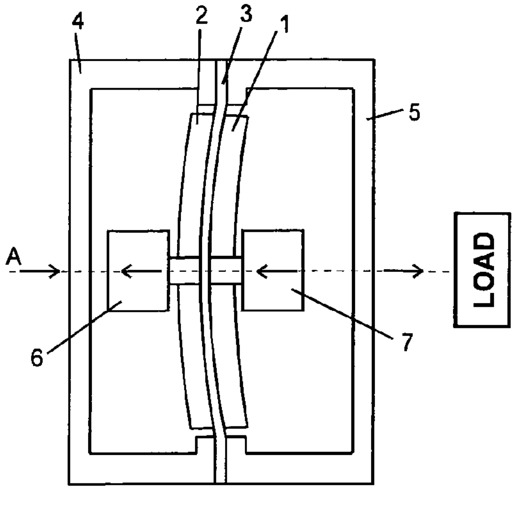
FIG. 1B is a schematic cross-sectional view showing the motion of the transducer of FIG. 1A under electrical drive with the piezoelectric discs moving oppositely causing bending motion which, in turn, causes increased relative motion between the pistons of the housing and the interior center masses.

In accordance with the present invention, there is now described herein a number of different embodiments for practicing the present invention. There is provided a dipole transducer for obtaining increased source strength by means of the additional mass which causes greater translational motion of the radiating housing and also allows a lower resonant frequency and mechanical Q. A cross-sectional view with labeled parts for a cylindrical dipole transducer with additional mass is shown in FIG. 1A. FIG. 1B shows the dynamic motion of the transducer of FIG. 1A during part of a drive cycle. In FIG. 1A, parts 1 and 2 are piezoelectric disc, with polarization direction indicated by the arrows, together operating in a planar bending mode. The discs 1 and 2 may be constructed with many different shapes such as a rectangular shape. The two discs 1, 2 may be cemented to a substrate 3 (typically a metal such as brass or aluminum). This substrate 3, in turn, is cemented between two cylindrical housing cups, 4 and 5, (typically a low density metal such as magnesium or aluminum).

The inertial masses, 6 and 7, (typically a high density metal such as steel or tungsten) are attached to the center of the substrate 3, although they can also be attached to the piezoelectric discs 1 and 2. The discs 1 and 2 are provided with a through passage at their center so as to receive the respective masses 6 and 7 so that the masses can be attached to the substrate 3. The piezoelectric pieces 1 and 2 are energized by a voltage V at terminals 8 and 9 through wires connected to electrodes on the piezoelectric discs 1 and 2. The interior space 10 is typically, but not limited, to a gas such as air. The exterior is typically, but not limited to, a fluid such as water.

Once energized with voltage V at the terminals 8 and 9, the housing that is comprised of piezoelectric elements 4 and 5, moves along the direction of symmetry labeled as direction or axis A in FIG. 1A. This motion is illustrated in FIG. 1B where here the arrows now indicate the direction of relative motion for a half-cycle.

In the illustration shown in FIG. 1B the piezoelectric discs 1 and 2 bend because of opposite radial expansion as a result of opposite polarization direction shown in FIG. 1A by the arrows. The bending causes the substrate 3 to bend causing the housing to move to the right, for this half-cycle, along the axis of symmetry A causing a compression in the medium on the right side and a rarefaction in the medium on the left side creating a dipole radiator. The direction is reversed on the next half-cycle. The inertial masses 6 and 7, each of mass M, enhance this motion and also provide a lower resonance frequency and lower mechanical Q.

Some simple equations for the housing displacement, resonance frequency and mechanical Q illustrate the advantage to using these inertial members of mass, M. With x the displacement of the housing along the axis of symmetry, with m the mass of the housing comprised of piezoelectric elements 4 and 5 and any additional radiation mass, with m' the dynamic mass of the bender section comprised of piezoelectric elements 1 and 2 and substrate 3, with K the short circuit dynamic stiffness of the bender, then the force is expressed as F=NV generated by the piezoelectric bender, where N is the electromechanical transduction transformer ratio. At low frequencies, below resonance, it can then be shown that the axial displacement of the housing $x=(F/K)/[1+m/(M+m')]$. Now for M>>m the displacement is x=F/K while for M=0, x=F/2K for a typical case of m'=m; and consequently the inclusion of the inertial masses can increase the displacement by a factor of two for large values of M. The resonance frequency may be written as $f_r=f_0[1+m/(M+m')]^{1/2}$ where $f_0$ is the ideal resonance frequency when the mass M is very large. Thus for M>>m, $f_r=f_0$ while for M=0, $f_r=f_o\sqrt{2}$ for the typical case of m'=m; and consequently, the inclusion of the inertial masses can decrease the resonance frequency by the factor √2 for large values of M. Another advantage is the reduction in the mechanical Q which may be written as $Q_m=Q_0[1+m/(M+m')]$ where $Q_0$ is the ideal Q for M>>m. Thus for M>>m, $Q_m=Q_0$ while for M=0, the $Q_m=2Q_0$ for the typical case of m'=m; and consequently, the inclusion of the inertial masses can decrease the mechanical Q by a factor 2 for large values of M.

Figure 2:
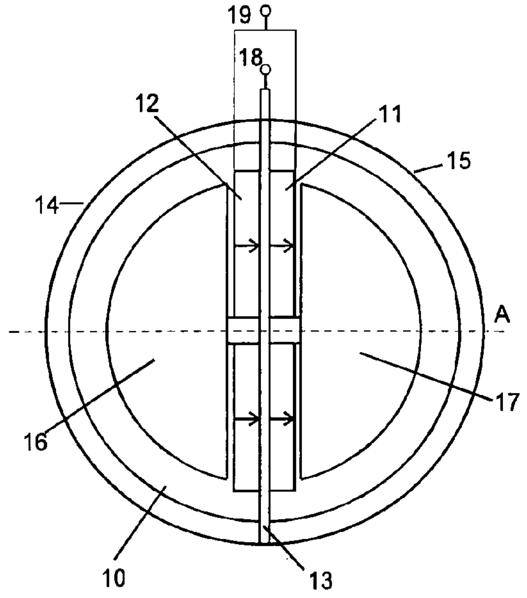
FIG. 2 is a schematic cross-sectional view of an alternate embodiment of the present invention employing a rigid spherical housing allowing a stiffer housing structure and more internal room for accommodating greater size internal masses.

The present invention is not limited to a cylinder and can take the form of a spherical structure as illustrated in FIG. 2 or other geometric shapes. Although the embodiment of FIG. 1A affords a low profile structure the spherical embodiment of FIG. 2 allows greater room for the inertial mass and a stiffer housing structure allowing deeper submergence with less interference from housing structural modes of vibration. In FIG. 2 parts 11 and 12 are piezoelectric discs with the polarization direction indicated by the arrows and together operating in a planar bending mode. The two discs are cemented to a substrate 13 (typically a metal such as brass or aluminum). This substrate 13 may be cemented between two hemispherical caps 14 and 15 (typically a metal such as magnesium or aluminum). The inertial masses 16 and 17 (typically a metal such as steel or tungsten) are attached to the center of the substrate 13, although they can also be attached to the piezoelectric discs 11 and 12. The discs 11 and 12 are provided with a through passage at their center so as to receive the respective masses 16 and 17 so that the masses can be attached to the substrate 3. The piezoelectric pieces 11 and 12 are energized by a voltage V at terminals 18 and 19 through wires connected to electrodes on the piezoelectric pieces 11 and 12. In addition to the spherical shape, the shell structure can also take on other forms such as a spheroid including oblate or prolate spheroids.

Figure 3:
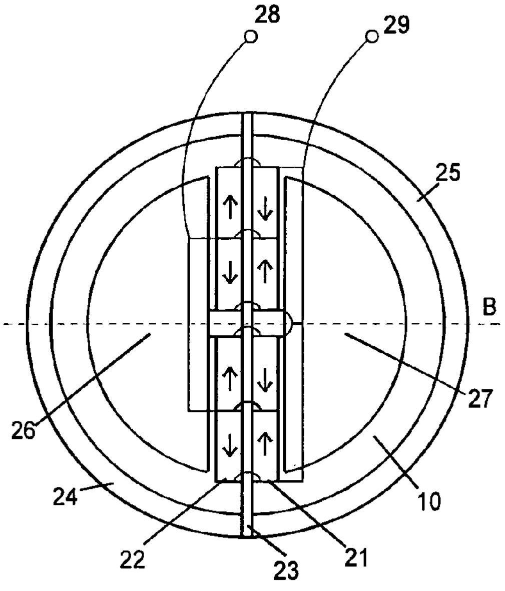
FIG. 3 is a schematic cross-sectional view of still another alternate embodiment of the present invention illustrating a transducer housing in the shape of a circular cylinder with the piezoelectric bender operating in a 33 mode but in opposition on the right and left sides causing bending and, in turn, causing the cylinder to move relative to the two masses.

The transducer of the present invention can also take the form of a circular cylinder driven by segmented piezoelectric bender bars as shown in a schematic cross-sectional view in FIG. 3. Mechanically isolated end caps (not shown) prevent the medium and acoustic radiation from entering into the interior space 10. In this case the radiation is not from the cylinder end caps (not shown) but from the sides of the cylinder. The cylinder cross-section may also be elliptical.

In FIG. 3, parts 21 and 22 are piezoelectric bars with the polarization direction indicated by the arrows and wired in parallel for 33-mode bending mode operation. The two bars 21 and 22 are cemented to a substrate 23 (in this case a non conductor). The substrate 23 may be cemented between two hemi-cylinders (or hemi-ellipses) 24 and 25 (typically a metal such as magnesium or aluminum). The inertial masses 26 and 27 (typically a metal such as steel or tungsten) are attached to the center of the substrate 23, although they can also be attached to the respective bars 21 and 22. The piezoelectric bars 21 and 22 are provided with a through passage at their center so as to receive the respective masses 26 and 27 so that the masses can be attached to the substrate 3. The piezoelectric bars 21 and 22 are energized by a voltage V at terminals 28 and 29 through wires connected to electrodes on the piezoelectric bars 21 and 22. In operation, the motion is in the direction of the B axis. The piezoelectric drive section that is comprised of bars 21 and 22, as well as substrate 23 of FIG. 3 may be comprised of left and right sections that are not reverse polarized but yet move extensionally in opposite directions by wiring the left and right sections in series and thus out of phase. The bars 21 and 22 may be polarized in a direction perpendicular to that show by the arrows of FIG. 3 and operated in a 31 mode.

Finite element models have been constructed to verify the performance of the transducer illustrated in FIG. 1A. A magnesium cylindrical housing was 3 inches in diameter and 2 inches long with a wall thickness of approximately 0.32 inches. The housing is driven with two piezoelectric ceramic discs that are each 2.25 inches diameter and 0.088 inches thick. The substrate is 0.07 inch thick and the two tungsten masses are each of a diameter of 0.56 inches and a length of 0.40 inches. The results show it produced an in-water resonant frequency of approximately 4,000 Hz and a source level of 80 dB/1 μPa@1 m at 1,000 Hz. Without the inertial masses the in-water resonant frequency was approximately 6,000 Hz with a source level of approximately 77.5 dB/1 μPa@1 m at 1,000 Hz. Transducer models were also fabricated with a housing constructed of aluminum. The measured results compared favorably with a corresponding finite element model.

Having now described a limited number of embodiments of the present invention, it should now become apparent to those skilled in the art that numerous other embodiments and modifications thereof are contemplated as falling within the scope of the present invention as defined in the appended claims. Examples of modification would be the use of other transduction devices or materials such as single crystal, magnetostriction or electrostriction material. The interior medium may be fluid. The exterior medium may be a mechanical load and in this case the transducer would be used as an actuator. As a result of reciprocity, the transduction device can be used as a receiver of sound as well as a transmitter of sound. As a receiver it produces an output voltage as a result of a pressure differential across the housing from an incoming acoustical wave or from a force producing an output voltage as an accelerometer.

What is claimed is:

1. For an acoustic transducer comprising:

a pair of electro-mechanical bender pieces;

a substrate to which the pair of bender pieces are fixedly attached to opposed planar side surfaces of the substrate;

an enclosing housing that defines an interior closed space of predetermined size;

said substrate having opposed ends that are respectively attached to opposed locations of the enclosing housing so as to divide the interior space into separate space portions;

means for electrically exciting the pair of bender pieces;

the improvement comprising:

a pair of respective and separately disposed masses attached to the center of the substrate at respective opposed planar side surfaces of the substrate;

said pair of respective and separately disposed masses disposed one in one of the space portions and the other in the other space portion;

each said mass including a main mass portion and a contiguous mass connection portion that is smaller in mass than the main mass portion;

each said bender piece having a respective center through passage for receiving therethrough a respective mass connection portion of said mass for attachment of the respective mass connection portions to opposed side surfaces of the substrate;

said mass connection portions each having respective free ends that are attached to the opposed surfaces of the substrate to provide a direct metal-to-metal contact of the mass connection portions with the respective opposed planar side surfaces of the substrate;

said pair of respective and separately disposed masses providing enhanced housing motion and attendant acoustical intensity under electrical drive conditions.

2. An acoustic transducer as set forth in claim 1 which is in contact with a mechanical load and provides actuated motion of the load.

3. An acoustic transducer as set forth in claim 1 which acts as a receiver and produces an output voltage as a result of a pressure differential across the housing from an incoming acoustical wave or force.

4. An acoustic transducer as set forth in claim 1 wherein the substrate is inert and the electro-mechanical bender pieces are piezoelectric bender pieces that are in the form of at least one of a plate, disc and bar.

5. An acoustic transducer as set forth in claim 1 wherein the pair of electro-mechanical bender pieces are piezoelectric bender pieces that are cemented to the substrate on opposed sides thereof.

6. An acoustic transducer as set forth in claim 1 wherein the electro-mechanical bender pieces are piezoelectric, electrostrictive, single crystal, magnetostrictive or other electro-mechanical drive material or transduction system wired to operate in the planar, 31 or 33 bender modes and in the form of discs, plates or bars.

7. An acoustic transducer as set forth in claim 1 wherein the enclosing housing is in the form of at least one of a sphere, spheroid, capped circular or elliptical cylinder.

8. An acoustic transducer as set forth in claim 1 wherein the electro-mechanical bender pieces are wired for opposite extension creating a bending mode which through their end mounting moves the enclosing housing relative to the attached pair of respective and separately disposed masses.

9. An acoustic transducer as set forth in claim 1 wherein the free ends of the mass connection portions are substantially planar to match the respective planar side surfaces of the substrate.

10. An acoustic transducer as set forth in claim 1 with an alternating electrical drive causing the housing to move in a translational body motion creating a dipole acoustic radiator, or conversely the device produces a voltage on detecting the acoustic particle velocity of an acoustic wave and in this case acting as a vector hydrophone for an incoming acoustic wave with maximum output for the wave arriving in the direction of translational motion.

11. An acoustic transducer as set forth in claim 1 wherein the pair of respective and separately disposed masses produce greater acoustic intensity on drive and greater output voltage on receive as well as a lower resonance frequency and lower mechanical Q.

12. An acoustic transducer as set forth in claim 1 wherein the enclosing housing is provided by two housing cups that together form the enclosing housing space.

13. An acoustic transducer as set forth in claim 12 wherein the opposed ends of the substrate are respectively attached between facing ends of two housing cups.

14. An acoustic transducer as set forth in claim 1 wherein the electro mechanical bender pieces are piezoelectric bender pieces that are wired to operate in the planar, 31 or 33 bender modes.

15. For an acoustic transducer comprising:

a pair of electro-mechanical bender pieces;

a substrate to which the pair of electro-mechanical bender pieces are fixedly attached to opposed planar side surfaces thereof;

an enclosing housing that defines an interior closed space of predetermined size;

said substrate having opposed ends that are respectively attached to opposed locations of the enclosing housing so as to divide the interior space into separate space portions;

means for electrically exciting the pair of electro-mechanical bender pieces;

the improvement comprising:

and a pair of respective and separately disposed masses attached to the center of the substrate at respective opposed planar side surfaces of the substrate;

said pair of respective and separately disposed masses disposed one in one of the space portions and the other in the other space portion;

each said mass including a main mass portion and a contiguous mass connection portion that is smaller in mass than the main mass portion;

each said electro-mechanical bender piece having a respective center through passage for receiving therethrough a respective mass connection portion of said mass for attachment of the respective mass connection portions to opposed side surfaces of the substrate;

said pair of respective and separately disposed masses providing enhanced housing motion and attendant acoustical intensity under electrical drive conditions wherein substrate is itself free of any passages in alignment with said respective center through passages of the electro-mechanical bender pieces.

16. An acoustic transducer as set forth in claim 15 wherein the electro-mechanical bender pieces are piezoelectric bender pieces.

17. For an acoustic transducer comprising:

a pair of electro-mechanical bender pieces;

a substrate to which the pair of electro-mechanical bender pieces are fixedly attached to opposed planar side surfaces thereof;

an enclosing housing that defines an interior closed space of predetermined size;

said substrate having opposed ends that are respectively attached to opposed locations of the enclosing housing so as to divide the interior space into separate space portions;

means for electrically exciting the pair of electro-mechanical bender pieces;

the improvement comprising:

and a pair of respective and separately disposed masses attached to the center of the substrate at respective opposed planar side surfaces of the substrate;

said pair of respective and separately disposed masses disposed one in one of the space portions and the other in the other space portion;

each said mass including a main mass portion and a contiguous mass connection portion that is smaller in mass than the main mass portion;

each said electro-mechanical bender piece having a respective center through passage for receiving therethrough a respective mass connection portion of said mass for attachment of the respective mass connection portions to opposed side surfaces of the substrate;

said pair of respective and separately disposed masses providing enhanced housing motion and attendant acoustical intensity under electrical drive conditions wherein of the electro-mechanical bender pieces and substrate, the respective mass connection portions are connected only to the substrate and wherein said substrate is itself free of any passages in alignment with said respective center through passages of the electro-mechanical bender pieces.

18. An acoustic transducer as set forth in claim 17 wherein the electro-mechanical bender pieces are piezoelectric bender pieces.

19. For an acoustic transducer comprising:

a pair of electro-mechanical bender pieces;

a substrate to which the pair of electro-mechanical bender pieces are fixedly attached to opposed planar side surfaces thereof;

an enclosing housing that defines an interior closed space of predetermined size;

said substrate having opposed ends that are respectively attached to opposed locations of the enclosing housing so as to divide the interior space into separate space portions;

means for electrically exciting the pair of electro-mechanical bender pieces;

the improvement comprising:

and a pair of respective and separately disposed masses attached to the center of the substrate at respective opposed planar side surfaces of the substrate;

said pair of respective and separately disposed masses disposed one in one of the space portions and the other in the other space portion;

each said mass including a main mass portion and a contiguous mass connection portion that is smaller in mass than the main mass portion;

each said electro-mechanical bender piece having a respective center through passage for receiving therethrough a respective mass connection portion of said mass for attachment of the respective mass connection portions to opposed side surfaces of the substrate;

said pair of respective and separately disposed masses providing enhanced housing motion and attendant acoustical intensity under electrical drive conditions wherein said substrate is a continuous, uninterrupted planar substrate extending at the area of the masses.

20. An acoustic transducer as set forth in claim 19 wherein the electro-mechanical bender pieces are piezoelectric bender pieces.

* * * * *